United States Patent
Zhang et al.

(10) Patent No.: US 9,136,165 B2
(45) Date of Patent: Sep. 15, 2015

(54) METHODS FOR STICTION REDUCTION IN MEMS SENSORS

(71) Applicant: Invensense, Inc., Sunnyvale, CA (US)

(72) Inventors: Cerina Zhang, Sunnyvale, CA (US); Nim Tea, Cupertino, CA (US)

(73) Assignee: INVENSENSE, INC., San Jose, CA (US)

( * ) Notice: Subject to any disclaimer, the term of this patent is extended or adjusted under 35 U.S.C. 154(b) by 78 days.

(21) Appl. No.: 13/909,842

(22) Filed: Jun. 4, 2013

(65) Prior Publication Data
US 2014/0353774 A1    Dec. 4, 2014

(51) Int. Cl.
*H01L 21/768* (2006.01)
*H01L 23/48* (2006.01)

(52) U.S. Cl.
CPC .......... *H01L 21/76838* (2013.01); *H01L 23/48* (2013.01)

(58) Field of Classification Search
CPC ....................................................... H01L 33/56
See application file for complete search history.

(56) References Cited

U.S. PATENT DOCUMENTS

| | | | |
|---|---|---|---|
| 7,098,576 B2 * | 8/2006 | Allison et al. | 310/328 |
| 2006/0098059 A1 * | 5/2006 | Ohguro et al. | 347/72 |
| 2012/0105385 A1 * | 5/2012 | Sasagawa et al. | 345/204 |
| 2012/0125747 A1 * | 5/2012 | Chu et al. | 200/181 |
| 2012/0313189 A1 | 12/2012 | Huang et al. | |

\* cited by examiner

*Primary Examiner* — Roy Potter
*Assistant Examiner* — Damian A Hillman
(74) *Attorney, Agent, or Firm* — Maryam Imam; IPxLaw Group LLP

(57) ABSTRACT

A method of the invention includes reducing stiction of a MEMS device by providing a conductive path for electric charge collected on a bump stop formed on a substrate. The bump stop is formed by depositing and patterning a dielectric material on the substrate, and the conductive path is provided by a conductive layer deposited on the bump stop. The conductive layer can also be roughened to reduce stiction.

12 Claims, 2 Drawing Sheets

METHODS FOR STICTION REDUCTION IN MEMS SENSORS

BACKGROUND

Various embodiment and methods of the invention relate generally to a microelectromechanical systems (MEMS) device and particularly to a MEMS device with reduced stiction.

Bump stops are commonly used in microelectromechanical systems (MEMS) device. A known problem with MEMS devices, which typically include a moving part, the actuator often undergoes chipping during shock or even normal operation when actuator comes into contact with another surface. This clearly leads to undesirable performance and potentially a shorter lifetime. Bump stops have been historically employed to aid in reducing the impact experienced by MEMS devices.

Bump stops used in MEMS devices/sensors can effectively limit travel distance of the MEMS actuator. However, use of a dielectric material, often times used to form the bump stops, introduces charging and interference in the electric field thereof, causing the MEMS actuator to drift or respond erratically and may even result in an electrical short.

Accordingly, a reliable MEMS device is needed.

SUMMARY

Briefly, a method of the invention includes reducing stiction of a MEMS device by providing a conductive path for electric charge collected on a bump stop, the bump stop being formed on a substrate. The bump stop is formed by depositing and patterning a dielectric material on the substrate, and a conductive path is provided by a first conductive layer deposited on the bump stop.

A further understanding of the nature and the advantages of particular embodiments disclosed herein may be realized by reference of the remaining portions of the specification and the attached drawings.

DETAILED DESCRIPTION OF EMBODIMENTS

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but not limited to gyroscopes, accelerometers, magnetometers, and pressure sensors. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device.

As used herein "stiction" is an undesirable situation which arises when surface adhesion forces are higher than the mechanical restoring force of a MEMS structure or MEMS device. Stiction is recognized to often occur in situations where two surfaces with areas in close proximity come in contact. The greater the contact area at both macroscopic and microscopic roughness levels, the greater the risk of stiction. At the microscopic level, soft materials can deform, effectively increasing contact area. Surfaces can be unintentionally brought into contact by external environmental forces including vibration, shock and surface tension forces that are present during sacrificial release steps often used in microfabrication processes. Adherence of the two surfaces may occur causing the undesirable stiction.

In the descriptions to follow, a method of the invention includes reducing stiction of a MEMS device by providing a conductive path for electric charge collected on a bump stop formed on a semiconductor substrate, wherein the bump stop is formed by depositing and patterning a dielectric material on the semiconductor substrate, and further wherein the conductive path is provided by a first conductive layer deposited on the bump stop.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Although the description has been described with respect to particular embodiments thereof, these particular embodiments are merely illustrative, and not restrictive.

Particular embodiments and methods of the invention disclose applying a thin layer of conformal conductive coating on dielectric material; a conductive (leakage) path is formed to mitigate charges on the dielectric material. In addition, the coated bump stops can be isolated from functional electrode to prevent short. A voltage potential with same polarity of MEMS actuator can be applied on coated bump stops to suppress charging and prevent short as the same time.

Figure 1:
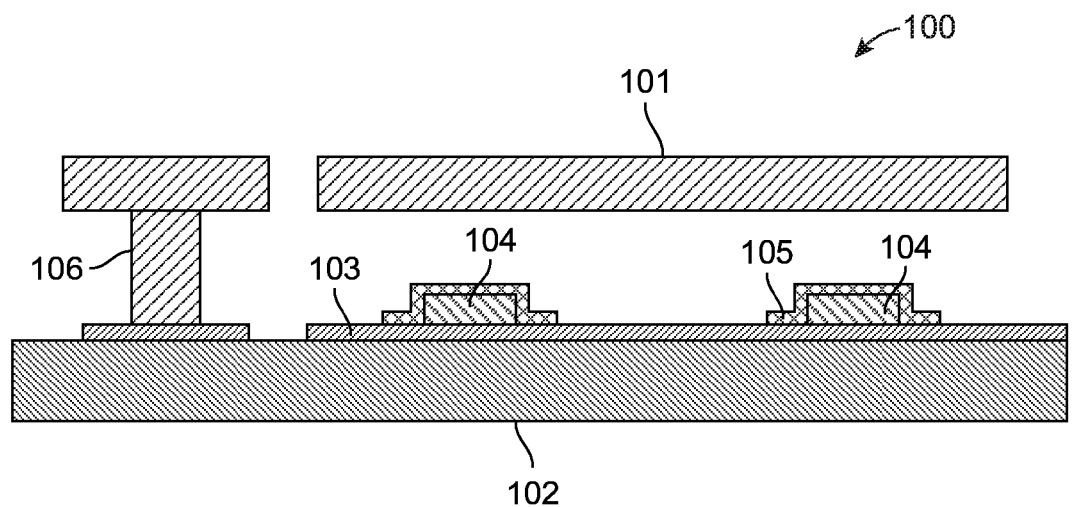
FIG. 1 shows an embodiment of the cross-section view of a MEMS device 100.

FIG. 1 shows an embodiment of the cross-section view of MEMS device 100. MEMS device 100 is shown to include substrate 102, MEMS actuator 101 and standoff 106. Further included in MEMS device 100 is an electrode 103 formed on top of substrate 102 on top of which is formed bump stop 104. Bump stop 104 is formed by depositing a dielectric material layer on top of electrode 103 and patterning on top of electrode 103. As shown in FIG. 1, bump stop 104 are formed underneath MEMS actuator 101. Further shown included in the MEMS device 100 is a conductive material layer 105, conformally coated on top of bump stop 104. In this manner, conductive material layer 105 encloses each bump stop. Bump stop 104 is therefore enclosed by conductive material layer 105 and electrode 103. Electrode 103 is typically a conductive layer. It is noted that electrode 103 is commonly referred to as the "bottom electrode".

In operation, MEMS actuator 101 moves up and down relative to bump stop 104 or tilts while doing the same. This occurs in response to movements of MEMS device 100. Bump stop 104 serve to prevent or reduce the effect of MEMS actuator 101 coming into contact with substrate 102 or electrode 103. That is, bump stop 104 serves as a mechanical stop for MEMS actuator 101. Standoff 106 defines the gap between MEMS actuator 101 and substrate 102.

In some embodiments, substrate 102 is a semiconductor substrate, such as a CMOS substrate and in some other embodiments it is a different and suitable type of substrate. In some embodiments, substrate 102 includes electrical components, such as but not limited to, electrodes, connectors, resistors, capacitors, and transistors. In some embodiments, the dielectric material layer of which bump stop 104 is made of the materials: Silicon Dioxide (SiO2), Silicon Nitride (Si3N4) Alumina (Al2O3), Aluminum Nitride (AlN), or other dielectric materials. In some embodiments, the conductive material layer 105 is made of the materials: Titanium Nitride (TiN), Spinel Lithium Titanate (Li4Ti5O12), Titanium dioxide (TiO2), Diamond-like carbon (DLC), or other suitable conductive material, which in the case where substrate 102 is a CMOS substrate, is a CMOS-compatible conductive material.

Use of dielectric material to form bump stops in electrostatic MEMS devices, such as device 100, undesirably results in charges accumulating and emitting in the electric field of the dielectric layer. This causes drift or erratic reaction of the MEMS actuator, such as MEMS actuator 101. Application of conductive material layer 105 on the dielectric material, effectively shields the charges thereby suppressing the charging effect by a conductive path. In FIG. 1, the conductive path is the path the charges in the electric field of bump stop 104 travel to electrode 103. This advantageously allows for leakage from bump stop 104 to electrode 103.

In some embodiments, not all bump stops 104 are coated with conductive material layer 105. In the latter case, for instance, bump stops are placed at certain locations where MEMS actuator 101 could potentially get in contact with substrate 102 or the electrode. In some embodiments a portion of bump stop 104 is covered with conductive material layer 105 providing a conductive path to electrode 103.

In another embodiment, bump stop 104 can be made of a suitable conductive material that can limit the motion of MEMS actuator 101 as well as without dielectric charging issue.

Figure 2:
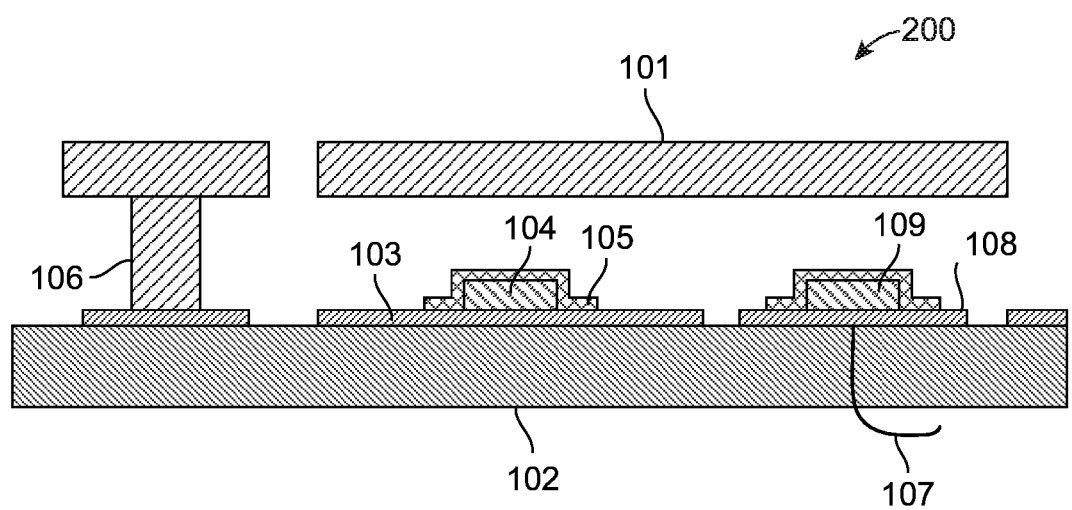
FIG. 2 shows another embodiment of the cross-section view of the MEMS device 200 with isolated bump stop.

FIG. 2 shows another embodiment of the cross-section view of the MEMS device 200. In this embodiment, MEMS device 200 is shown to employ an electrical connection from electrode 103 allowing a voltage potential to be applied through the electrical connection. In FIG. 2, a wire (or "electrical connection") 107 is shown connected to electrode 108 allowing a voltage potential to be applied to the electrode 108 through wire 107.

In another embodiment, the applied voltage potential via wire 107 to bump stop 109 is the same polarity as MEMS actuator 101, the repulsion forces between MEMS actuator 101 and bump stop 109 further prevents stiction. A voltage potential that is substantially the same as the voltage potential of MEMS actuator 101 can be applied to electrode 108 via wire 107. Bump stop 109 coated with conductive layer 105 can be further isolated to prevent shorts when the MEMS actuator 101 comes in contact with bump stop 109.

Figure 3:
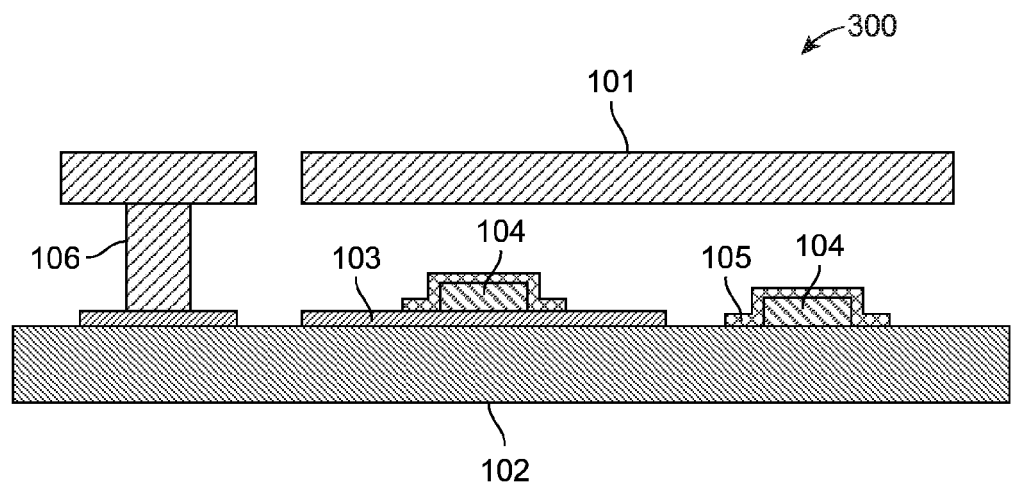
FIG. 3 shows another embodiment of the cross-section view of the MEMS device 300 with bump stop on the substrate.

FIG. 3 shows another embodiment of the cross-section view of the MEMS device 300. As shown in FIG. 3, bump stop 104, after having been coated with conductive layer 105 can be either formed on electrode 103, as also shown in the embodiments of FIGS. 1 and 2, or directly on substrate 102, a semi conductive material.

Figure 4:
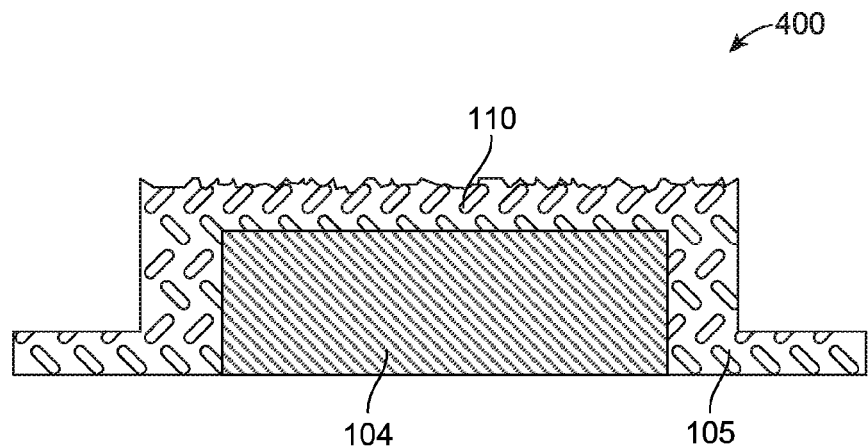
FIG. 4 shows yet another embodiment of the cross-section view of the bump stop.

FIG. 4 shows yet another embodiment of the cross-section view of bump stop 400. In the embodiment of FIG. 4, conductive layer 105, covering bump stop 104, has roughened surface 110. Roughened surface 110 reduces the contact area between MEMS actuator 101 and bump stop 104 to further reduce stiction when the bottom surface of MEMS actuator 101 comes into contact with the top surface of conductive layer 105. Stiction is reduced because the roughness of roughened surface 110 results in less contact area with MEMS actuator 101, as stiction is proportional to contact area. Further, conductive layer 105 made of TiN or DLC act as a lubricant layer. In some embodiments, the roughness of the surface 110 is approximately 10-15 nanometers and the conductive layer 105 is approximately up to 50 nanometer thick.

In some methods and embodiments of the invention, roughened surface 110 is formed by subtractive methods, such as dry etching or wet etching among other known methods. In some embodiments and methods of the invention, roughened surface 110 is formed by additive methods, such as chemical vapor deposition (CVD), physical vapor deposition, evaporation, or sputtering, among other known methods. The choice of the type of etching process used to form roughened surface 110 is typically based upon the material property employed in making conductive layer 105.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A MEMS device comprising:
   a MEMS actuator;
   a substrate opposing the MEMS actuator; and
   a bump stop formed on the substrate to limit motion of the MEMS actuator,
   wherein the bump stop is formed from a dielectric material and covered with a first conductive layer, a conductive path formed by the first conductive layer thereby substantially reducing electric charge collected on the bump stop.

2. The MEMS device of claim 1, further comprising a second conductive layer between the substrate and the bump stop.

3. The MEMS device of claim 2, wherein the second conductive layer is an electrode.

4. The MEMS device of claim 2, wherein a portion of the second conductive layer is isolated.

5. The MEMS device of claim 2, wherein a portion of the second conductive layer is isolated and a voltage potential is applied to the portion of the first conductive layer.

6. The MEMS device of claim 5, where in the voltage potential is substantially the same as that of the MEMS actuator.

7. The MEMS device of claim 5, where in the voltage potential has the same polarity as that of the MEMS actuator.

8. The MEMS device of claim 1, wherein the first conductive layer has a rough surface to reduce contact area with the MEMS actuator.

9. The MEMS device of claim 1, wherein the substrate is a semiconductor substrate.

10. The MEMS device of claim 1, wherein the substrate includes electrical components.

11. The MEMS device of claim 1, wherein the first conductive layer physically contacts the bump stop.

12. The MEMS device of claim 1, wherein the bump stop is partially enclosed by the first conductive layer.

* * * * *